United States Patent [19]

Hoenig

[11] Patent Number: 4,761,611
[45] Date of Patent: Aug. 2, 1988

[54] APPARATUS FOR MEASURING WEAK MAGNETIC FIELDS HAVING A DC-SQUID ARRAY AND GRADIOMETER ARRAY

[75] Inventor: Eckhardt Hoenig, Erlangen, Fed. Rep. of Germany

[73] Assignee: Siemens Aktiengesellschaft, Berlin and Munich, Fed. Rep. of Germany

[21] Appl. No.: 854,773

[22] Filed: Apr. 22, 1986

[30] Foreign Application Priority Data

Apr. 26, 1985 [DE] Fed. Rep. of Germany ....... 3515237

[51] Int. Cl.$^4$ .......................................... G01R 33/035
[52] U.S. Cl. ..................................... 324/248; 307/306
[58] Field of Search ........................ 324/248; 307/306; 357/5; 335/216

[56] References Cited

U.S. PATENT DOCUMENTS 2,966,647 12/1960 Lentz ................................. 307/306
4,588,947 5/1986 Ketchen ............................ 324/248

FOREIGN PATENT DOCUMENTS 0111827 10/1984 European Pat. Off. .

OTHER PUBLICATIONS

Goodman et al, "Superconducting Instrument Systems", Proceedings of the IEEE, Jan. 1973, vol. 61, No. 1, pp. 20–27.
Bickford et al, "Flexible I/O Cable to Thin Film Connector", IBM Technical Disclosure Bulletin, vol. 25, No. 36, 8/1982, pp. 1701–1702.
Cryogenics, vol. 23, No. 5, May 1983, pp. 263 and 264.
Rev. Sci. Instrum, vol. 55, No. 6, Jun. 1984, pp. 952–957.
Rev. Sci. Instrum, vol. 53, No. 12, Dec. 1982, pp. 1815–1845.
IEEE Trans Magn., vol. MAG-17, No. 1, Jan. 1981, pp. 400–403.
Physicia, vol. 107B, 1981, pp. 29 and 30.
SQUID '80, W. D. Gruyter and Co., Berlin–New York, May 1980, pp. 399–415.

Primary Examiner—Reinhard J. Eisenzopf
Assistant Examiner—Walter E. Snow
Attorney, Agent, or Firm—Kenyon & Kenyon

[57] ABSTRACT

Apparatus comprising a gradiometer array having a plurality of gradiometers, with which at least one SQUID array having a multiplicity of DC-SQUIDs is associated therewith forms, with the respective coupling coils, modulation coils and superconducting shielding rings serving for the magnetic decoupling, a thin-film structure. Furthermore, metallic coupling by ground planes is provided for at least part of the common leads. By the metallic coupling and magnetic decoupling of the parallel measuring channels, a simple embodiment with few contacts is obtained which makes possible parallel signal processing without crosstalk.

8 Claims, 3 Drawing Sheets

APPARATUS FOR MEASURING WEAK MAGNETIC FIELDS HAVING A DC-SQUID ARRAY AND GRADIOMETER ARRAY

BACKGROUND OF THE INVENTION

The present invention relates to apparatus for measuring weak magnetic fields, having at least one DC-SQUID comprising a planar thin film structure including Josephson junctions and a coupling coil.

It is known to use for measuring weak variable magnetic fields, for instance, in a field intensity range below $10^{-10}$ T, and in particular under $10^{-12}$ T, superconducting quantum interference elements which are known by the designation "SQUID" (Superconducting Quantum Interference Device). These elements are preferably used in medical technology, particularly in magnetocardiography, where magnetic fields of the heart in the order of about 50 pT are measured as well as in magnetoencephalography, where the magnetic fields of the brain in the order of about 0.1 pT are to be measured. The device comprises substantially a detector coil which, together with a coupling coil, forms a flux transformer. For picking up and processing signals, electronic circuitry is associated with the SQUID. Since the magnetic fields to be measured are up to six orders of magnitude smaller than external interference fields, appropriate shielding is necessary. Because of its greater sensitivity, a DC-SQUID (direct-current SQUID) can be used which contains two Josephson junctions. With an associated compensation coil, the detector coil forms a so-called gradiometer. With gradiometers of zero$^{th}$, first or higher order, the biomagnetic near field which is still non-uniform in the gradiometer range can be determined selectively (Rev. Sci. Instrum. 53 (12), December 1982, pages 1815 to 1845).

A design of the DC-SQUID with the associated coupling coil as a thin-film transformer, in which the flat spiral-shaped turns of the coupling coil are arranged above the SQUID, provides good magnetic coupling and needs little space. A coupling coil with 100 turns, for instance, requires only about 2 mm$^2$ (IEEE Transactions on Magnetics, vol. MAG-17, no. 1, January 1981, pages 400 to 403).

In order to obtain a three-dimensional field distribution, measurements must be made successively in time at different points of the region to be examined. The difficulty then arises, however, that the field data are no longer coherent over the measuring times required therefor and, in addition, measuring times are obtained which cannot be tolerated clinically. While in principle the measuring time can be shortened with known apparatus which contains several parallel measuring channels, each with an RF-SQUID (radio-frequency SQUID) (Physica 107B (1981), pages 29 and 30, North Holland Publishing Company), a gradiometer array with which at least one SQUID array is associated cannot be fabricated with this design.

SUMMARY OF THE INVENTION

It is an object of the present invention to provide an apparatus for measuring weak magnetic fields which allows, with a multiplicity of gradiometers and a corresponding number of DC-SQUIDs, a simple design having a relatively small number of contacts and, which, at the same time, allows dense packing of the thin-film structures and also prevents crosstalk of the individual measuring channels.

The above and other objects of the present invention are achieved by an apparatus for measuring weak magnetic fields having at least one DC-SQUID having Josephson junction means and coupling coil means, and which forms a planar thin-film structure, and further comprising gradiometer array means having a plurality of gradiometer means, at least one SQUID array means having a plurality of DC-SQUIDs being associated therewith, said DC-SQUIDs being arranged with the Josephson junction means, the coupling coil means and modulation coil means as a module or unit or assembly comprising a thin-film structure on a common substrate, magnetic decoupling means being provided for said module comprising a superconducting shielding ring surrounding the module and metallic coupling means comprising ground plane means being provided for at least one part of common terminal means of the module. By the metallic coupling of n thin-film structures, n signal lines and also n BIAS lines are saved and thereby, the number of line connections is reduced considerably. Similarly, also n terminal contacts are saved by the metallic coupling of n modulation lines. By the metallic coupling of all coupling coils, n transformer lines and thereby also n terminal contacts are saved.

By the arrangement of the closed superconducting shielding rings which are respectively associated with one structured unit formed by the DC-SQUID with its coupling and modulation coil, magnetic decoupling is obtained which prevents crosstalk of the individual channels. By designing the common SQUID and coupling coil contacts as large-area thin films which are known by the designation "ground planes", the coil terminals are decoupled magnetically from each other.

The common substrate can comprise, for instance, a ceramic, preferably of semiconductor material and particularly of silicon and also comprising preferably a terminal contact for each of a common signal line and a common BIAS line of the DC-SQUIDs and, in addition, further comprising a common terminal for the return lines of the gradiometers. These electrical terminals are generally designed as planar contact terminals, so-called contact pads, which allow a line connection, particularly of the normal conducting connections, by bonding. The substrates can preferably be inserted into a printed circuit board which generally comprises reinforced fiberglass plastic provided with a pattern of conductor runs and containing a suitable cutout. On this printed circuit board can be arranged advantageously at the same time part of the electronics, for instance, filters and preamplifiers. By the simultaneous signal pickup and parallel signal processing, a correspondingly shortened time for registering physiological magnetic fields is obtained.

In a special embodiment of the apparatus, additional shielding action is obtained if the substrate serving as the chip is arranged on a superconducting base plate. Thereby, magnetic decoupling of the adjacent contact pads is obtained at the same time. In a preferred embodiment, the substrate may be provided on its lower flat side with a thin superconducting overlay which also covers the adjoining surface region of the printed circuit board and can preferably be designed as a ground plane.

The normal-conducting terminals of the substrate can be connected in a manner known per se by bonding with the copper conductor runs of the printed circuit board. These connecting conductors are magnetically decoupled by the superconducting base plate.

For the superconducting terminals of the flux transformers, a detachable line connection may be provided which can preferably be designed as a plug-in contact and particularly as a ring contact.

Furthermore, a multiplicity of pressure contacts which may be designed as spring contacts can be provided for connecting the superconducting terminals of the gradiometer to the contact pads of the SQUID array. Particualrly well suited is a compact packet of superconducting contact springs, a so-called contact comb. By these contact springs, the thickness of which is determined by the spacing of the contact pads on the semiconductor substrate and which are insulated from each other by an electrically insulating overlay or intermediate layer, a pressure contact between the superconducting terminals of the chip and the input and output lines of the gradiometer coils is established in a particularly simple manner. Since these contact springs are already arranged on the substrate side-by-side with the spacing of the contact pads, the contact comb can be adjusted simply by shifting and can subsequently be fixed in its position, for instance, by screws. The superconducting base plate is then preferably designed so that it is also arranged below the contact comb and thereby likewise decouples these superconducting terminals magnetically.

BRIEF DESCRIPTION OF THE DRAWINGS

The invention will be explained in greater detail in the following detailed description with reference to the drawings, in which.

DETAILED DESCRIPTION

Figure 1:
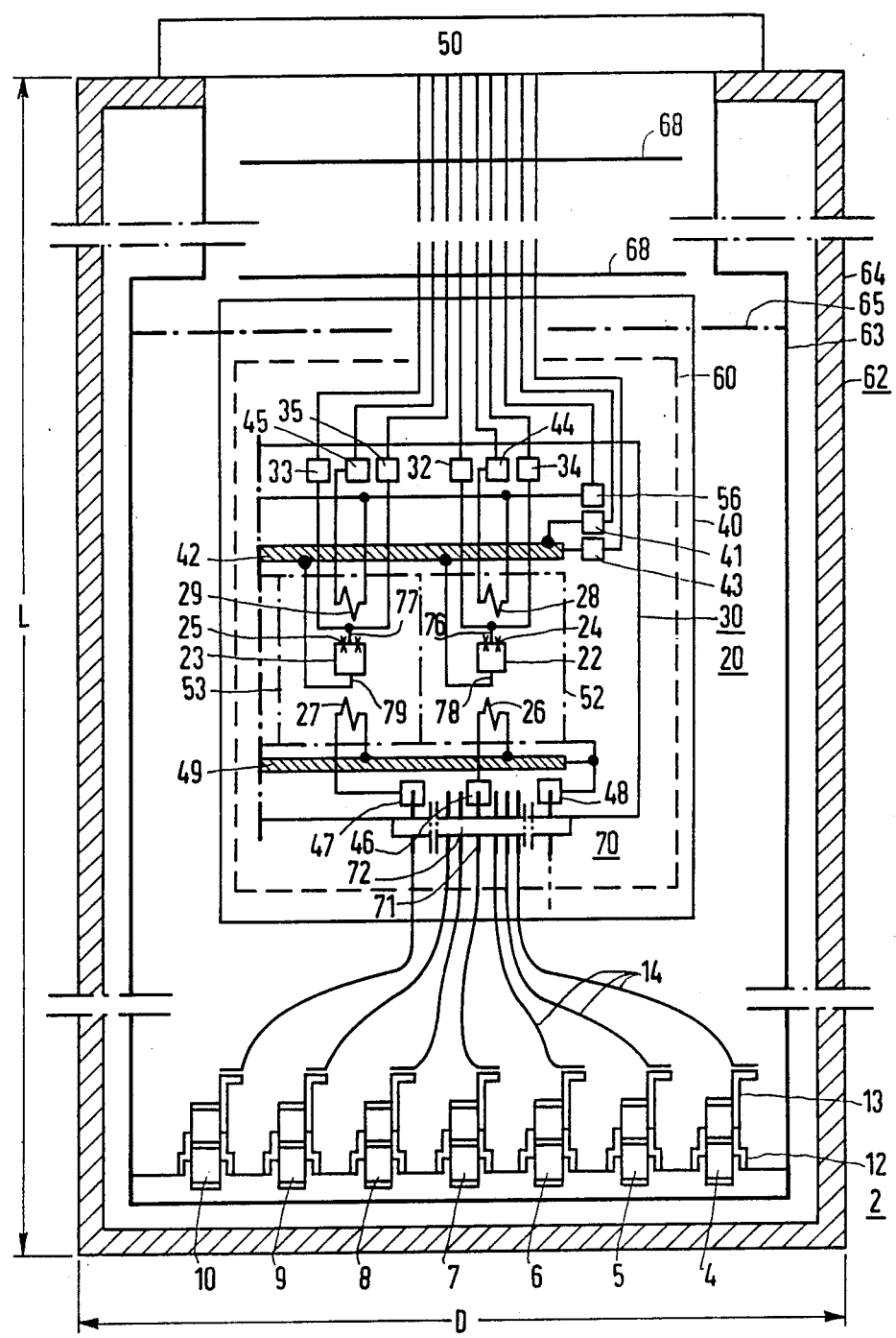
FIG. 1 shows a schematic design of the apparatus according to the invention.

With reference now to the drawings, in the embodiment of apparatus for measuring weak magnetic fields according to FIG. 1, a gradiometer array 2 is provided which contains a multiplicity of gradiometers, for instance, at least 30 gradiometers, of which only 7 are indicated in the figure for simplification and are designated with 4 to 10. They can be, for instance, second-order gradiometers, the detector coils of which, not specifically designated, are arranged in a manner known per se with their associated compensation coils in three planes on top of each other. These gradiometers 4 to 10 can be inserted into a separate holder 12 which may comprise, for instance, a profiled ring of plastic, particularly tetrafluoroethylene (teflon). The gradiometers 4 to 10 are provided with contact devices for the leads which are shown as terminal lugs 13, to which their electrical leads 14 are fastened, and the return conductors of which are not shown in the figure for the sake of simplification. These superconducting leads can be conducted in capillaries in a manner known per se.

To the gradiometers 4 to 10, corresponding individual measuring channels are assigned, each of which contains a SQUID (in the embodiment, a DC-SQUID). With, for instance, 30 gradiometers and, correspondingly, 30 SQUIDs, these SQUIDs can be subdivided, for instance, into three groups, which each form a SOUID array 20 with 10 SQUIDs. For clarity, only two SQUIDs of these 10 are shown in the schematic circuit and are designated with 22 and 23. In the embodiment using DC-SQUIDs, these SQUIDs contain, as is well known, two Josephson junctions 24 and 25 which, with their associated coupling coils 26 and 27 as well as a modulation coil 28 and 29, respectively, are arranged as a structural unit on a common semiconductor substrate 30 which may preferably comprise silicon. The structural units are designed as separate planar thin-film structures, the electrically conducting parts of which are separated by electrically insulating intermediate layers. For each of the SQUIDs 22 and 23, magnetic decoupling is provided which comprises superconducting rings 52 and 53, respectively, which are indicated dash-dotted and, in the embodiment shown, form a common structural unit for the SQUID array 20 but may also comprise separate superconducting rings.

The semiconductor substrate 30 can preferably be arranged in a cutout of a circuit board 40 which is designed accordingly but is not specifically designated in the figure. The circuit board is provided in a manner known per se with a pattern of conductor runs, not shown in the figure, on its upper flat side.

The common connecting leads 76 and 77 of the SQUIDs 22 and 23 are provided with contact pads 32 and 33 for connecting the signal lines and with separate contact pads 34 and 35 for connecting the BIAS lines. The common return lines 78 and 79 can be designed preferably as planar thin-film contacts and in particular as a ground plane 42 which is indicated in the figure only as a wide strip contact and is provided with a contact pad 43 for the signal return line and with a further contact pad 41 for the BIAS return line. The metallically coupled leads of the coupling coils 28 and 29 as well as the coupling coils 26 and 27 are designated in the figure with 44 to 47. The signal and BIAS lines of the SQUIDs 22 and 23 as well as of the modulation coils 28 and 29 are connected via electrical conductors, not specifically designated, to electronic circuitry 50 which comprises in a manner known per se the necessary preamplifiers as well as lock-in amplifiers for the SQUIDs 22 and 23 and, in addition, the data and control system for the SQUID array 20. With this electronic circuitry 50 is generally also associated an output unit, not shown in the figure.

In some cases it may be advantageous to also design the metallically coupled leads of the modulation coils 28 and 29 which are connected to a contact pad 56, as a ground plane. The superconducting shielding rings 52 and 53 can, for instance, be connected to the contact pad 48, to which also the return lines of the gradiometers 4 to 10, not shown in the figure, are connected.

For the SQUID array 20 with its contact pads and in particular, its superconducting leads, additional magnetic shielding preferably further may be provided which can comprise a flat superconducting base body 60 which is connected to the semiconductor substrate 30 in a form-locking manner, for instance, by cementing. This base body 60 is arranged below the printed circuit board 40 and therefore is indicated dashed in the figure. Its extent is chosen so that it is also arranged under the contact pads and the adjacent parts of the leads of the printed circuit board 40 and thus, also serves as magnetic shielding for these parts of the connecting leads.

For electrically connecting the gradiometer array 2 to the SQUID array 20, a detachable line connection can preferably be provided which can comprise, for instance, a multiple-contact connector, not shown in the figure, with two ring contacts. In a preferred embodiment, a contact comb with spring contacts 71 can be provided as the line connection 70 for the superconducting leads of the SQUID array 20; they establish pressure contacts between the contact pads 46, 47 and 49 of the SQUID array 20 and the individual leads 14 of the gradiometer array 2. The superconducting connecting conductors 14 for the gradiometers are then connected to one of the contact springs. The contact comb is pressed against the contact pads of the semiconductor substrate 30 by means of the common pressure plate 72. In the practical embodiments of the contact comb, the spring contacts 71 are arranged without substantial spacing side-by-side but electrically insulated from each other.

The gradiometers 4 to 10 of the gradiometer array 2 with the SQUID array 20 are arranged in a manner known per se in a double-wall Dewar vessel 62, the inner container of which is designated with 63 and the outer container with 64. The Dewar vessel 62 is filled up to above the SQUID array 20 with liquid helium, the surface level 65 of which is indicated dash-dotted in the figure. The gradiometer array 2 and the SQUID array 20 are therefore kept at cryogenic temperature during the operation of the device. In the space between the inner and the outer container, generally a superinsulation, not shown in the figure, is provided. Several radiation shields 68 are arranged between the SQUID array 20 and the electronic circuit 50.

In the practical embodiment of the apparatus for measuring weak magnetic fields, the length L of the entire arrangement can, for instance, be more than 100 cm and the printed circuit board 40 or several printed circuit towards-arranged parallel to each other can be fastened within the Dewar vessel 62.

In the embodiment of the magnetocardiograptic apparatus, the diameter D at the end containing the gradiometer array 2 can be, for instance, about 30 cm. For special embodiments such as are used, for instance, for magnetoencephalography, it may be possible to use a curved array, the shape of which approaches that of a spherical sector and the inside diameter of which may be about 20 cm. This embodiment with a detachable line connection between the gradiometer array 2 and the SQUID array 20 has the advantage that the entire gradiometer array 2 can be designed as a plugin module.

Figure 2:
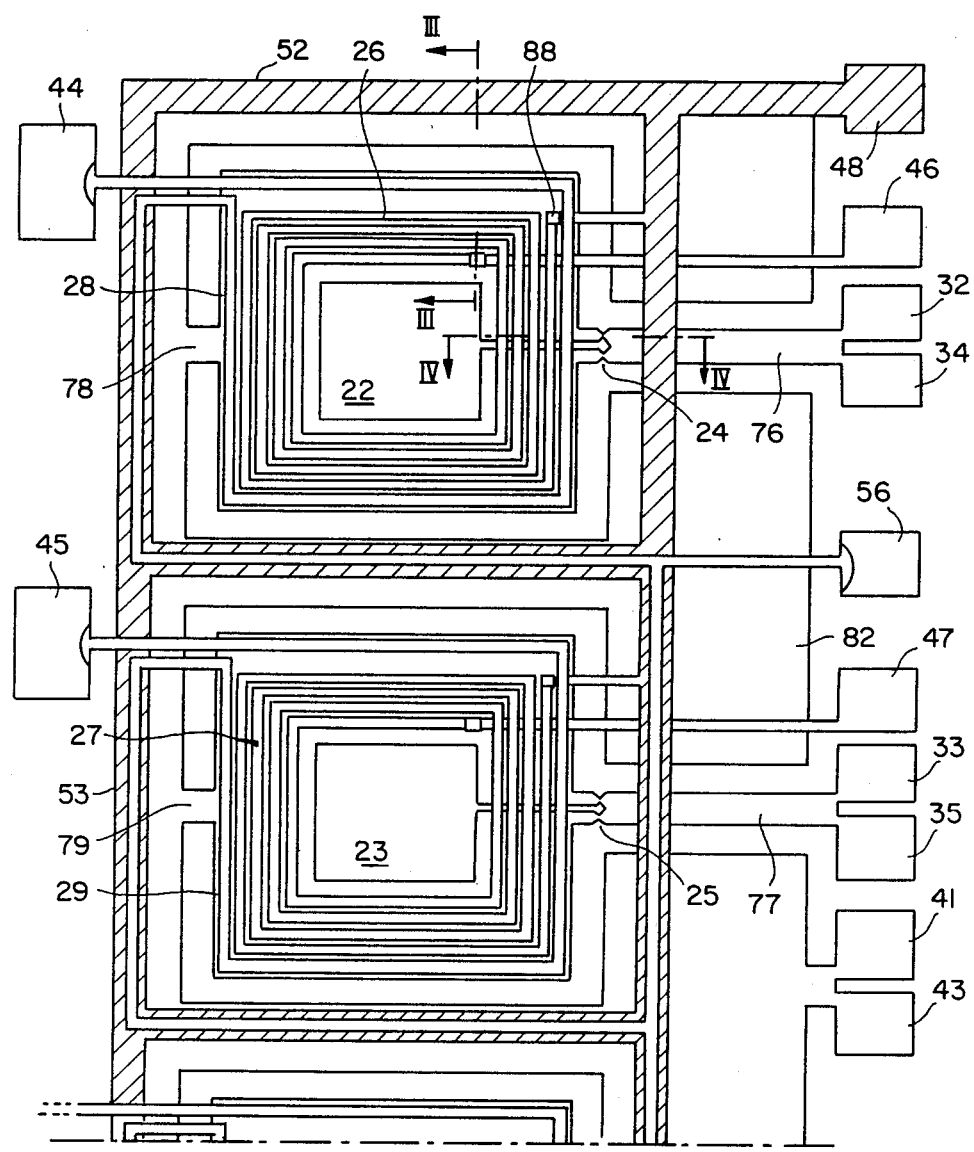
FIG. 2 shows an embodiment of several SQUIDs with their coupling and modulation coils as building blocks having a thin-film structure and their metallic coupling and magnetic decoupling.

In the embodiment of the SQUID array 20 according to FIG. 2, only two SQUIDs are shown and designated with 22 and 23, of the plurality of DC-SQUIDs with their Josephson junctions as well as their coupling coils and modulation coils according to FIG. 1. They are arranged as structural units in thin-film technology on the substrate, not shown. An electrical insulating spacer which is required for the mutual electrical insulation of electrically conducting parts of the thin-film structures and which can preferably comprise silicon oxide SiO or silicon dioxide $SiO_2$, is likewise not shown in the figure for the sake of simplification. The common, wide leads 76 and 77, respectively, are signal and bias lines to the corresponding half-ring of the SQUIDs 22 and 23 via the two Josephson junctions 24 and 25 and from the end of the half-ring to a ground plane 82 again with large-area connecting conductors 78 and 79, respectively.

The leads from the contact pads 46 and 47 to the coupling coils 26 and 27, respectively, are conducted via the ground plane 82 which thus serves as a magnetic shield for this line section. From the contact pads 44 and 45, a lead goes to each of the modulation coils 28 and 29, which are arranged concentrically with the coupling coils 26 and 27 and to the SQUIDs 22 and 23. For the common return line of all modulation coils, the contact pad 56 is provided. The subassemblies with a thin-film structure with the SQUIDs 22 and 23 and the associated coupling coils 26 and 27 as well as modulation coils 28 and 29 are each associated with one of the shielding rings 52 and 53 which are combined in the embodiment shown but can also be divided into separate rings. With these shielding rings 52 and 53 can preferably be associated a common contact pad 48, to which they are connected via a connecting line, not designated specifically.

Figure 3:
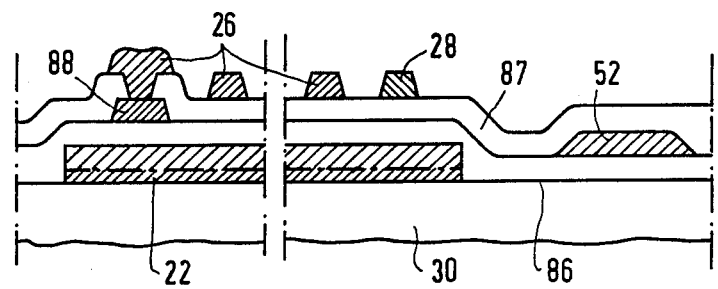
FIGS. 3 and 4 show a schematic of the layer structure of one of the SQUIDs having thin-film structure.

All modules of the SQUID array 20 with their DC SQUIDs on the substrate 30 are manufactured together in thin-film technology. As indicated in the cross section of FIG. 3 schematically for only one of the modules, double layers of a superconducting metal, preferably niobium, are first deposited for the individual SQUIDs with their Josephson junctions, of which the first layer has a thickness of, for instance, about 1000 Å and the second layer about twice the thickness. In the figure, only the double layer for SQUID 22 is shown and indicated by a dash-dotted parting line. In the following operation, the SOUIDs are covered by a large area insulation layer 86 which may preferably comprise silicon oxide SiO or silicon dioxide $SiO_2$ and is provided with recesses for the contact pads. Subsequently, the metallization for tne shielding ring 52 and the leads of the coupling coil 26 is performed, of which only the inner terminal 88 is visible in the figure, as well as a metallic covering, not visible in the figure, for the gap between the two SQUID half-rings. The coupling coil 26 itself lies in the higher plane. In the third operation, these metallizations are covered by a further insulating layer 87 which is provided with openings for the coil leads. Then, the coupling coil and the modulation coil 28 with, for instance, a single turn, are put in place in a joint operation. Deviating from the embodiment shown, the shielding ring 52 can preferably be designed as a ground plane.

Figure 4:
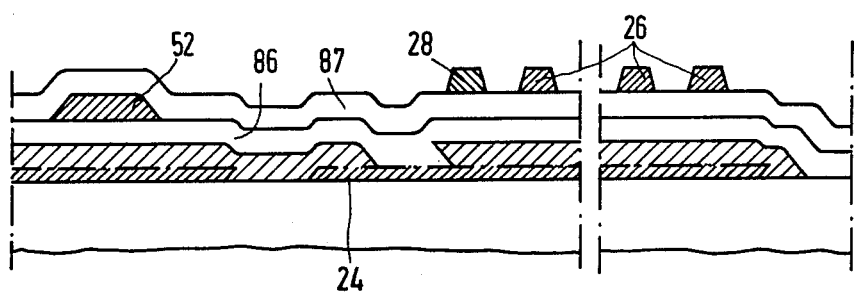

In the section according to FIG. 4, besides the turns of the coupling coil 26, the modulation coil 28 and the shielding ring 52 with the insulating layers 86 and 87, also the construction of one of the Josephson elements 24 is indicated, the tunnel barrier of which can be preferably prepared by the so-called floating-mask method, as is known, for instance, from "Fabrication and characterization of thermally recyclable submicron niobium-niobium Josephson junctions" in SQUID, '80, W. d. Gruyter and Co., Berlin-New York, May 1980, pages 399 to 415.

In the foregoing specification, the invention has been described with reference to specific exemplary embodiments thereof. It will, however, be evident that various modifications and changes may be made thereunto without departing from the broader spririt and scope of the invention as set forth in the appended claims. The specification and drawings are, accordingly, to be regarded in an illustrative rather than a restrictive sense.

What is claimed is:

1. Apparatus for measuring weak magnetic fields, comprising at least one DC-SQUID array means, said DC-SQUID array means comprising of a plurality of DC-SQUIDs, each of said DC-SQUIDs comprising Josephson junction means and coupling coil means, the apparatus further comprising gradiometer array means having a plurality of gradiometer coil means, each of said gradiometer coil means being coupled to a respective DC-SQUID, a modulation coil means being associated with a respective DC-SQUID, said Josephson junction means, coupling coil means and modulation coil means comprising a module and being deposited as a planar thin-film structure on a common substrate, each module having terminal means and magnetic decoupling means comprising a superconducting shielding ring surrounding the module and the apparatus further comprising metallic coupling means for electrically coupling together at least one part of the terminal means of the module to selected other parts of the terminal means of the same or others of said modules by means of ground plane means.

2. The apparatus recited in claim 1, wherein said DC-SQUIDS have common electric return lines via the ground plane means.

3. The apparatus recited in claim 1, wherein the ground plane means is provided for common electric return lines of the coupling coil means.

4. The apparatus recited in claim 1, wherein an additional common magnetic shield means for all structual units including the leads thereof is provided which comprises superconducting base body means connected in a form-locking manner to one flat side of the substrate.

5. The apparatus recited in claim 4, wherein the substrate is arranged in an opening of a printed circuit board and the extent of the flat sides of the superconducting base body means is so substantially larger than the opening of the printed circuit board, that the base body means is still arranged, at least partially, below superconducting outgoing and return lines of the SQUID array means.

6. The apparatus recited in claim 4, wherein the superconducting base body means comprises a second thin film ground plane means arranged below the substrate.

7. The apparatus recited in claim 1, further comprising a detachable line connection for a superconducting connecting conductor between the SQUID array means and the gradiometer array means.

8. The apparatus recited in claim 1, wherein the ground plane means for electrically coupling together at least one part of the terminal means of the modules comprises the thin-film ground plane means.

* * * * *